United States Patent [19]

Ohkura et al.

[11] Patent Number: 5,198,370
[45] Date of Patent: Mar. 30, 1993

[54] METHOD FOR PRODUCING AN INFRARED DETECTOR

[75] Inventors: Yuji Ohkura; Tohru Takiguchi, both of Itami, Japan

[73] Assignee: Mitsubishi Denki Kabushiki Kaisha, Tokyo, Japan

[21] Appl. No.: 830,852

[22] Filed: Feb. 4, 1992

[30] Foreign Application Priority Data

Apr. 17, 1991 [JP] Japan .................... 3-115631

[51] Int. Cl.$^5$ ................ H01L 31/0296; H01L 21/385
[52] U.S. Cl. .......................... 437/3; 437/6; 437/160; 437/162
[58] Field of Search ............ 437/3, 6, 160, 162; 748/DIG. 64; 357/30 B, 30 R

[56] References Cited

U.S. PATENT DOCUMENTS

| 4,559,695 | 12/1985 | Baker | 437/3 |
| 5,075,748 | 12/1991 | Hisa | 357/30 |

FOREIGN PATENT DOCUMENTS

| 59-181583 | 10/1984 | Japan | 437/3 |
| 63-43366 | 2/1988 | Japan | 357/30 B |
| 2197984 | 6/1988 | United Kingdom | 357/30 B |

Primary Examiner—T. N. Quach
Attorney, Agent, or Firm—Leydig, Voit & Mayer

[57] ABSTRACT

In a method of producing an infrared detector, a first conductivity type semiconductor layer, in which lattice vacancies acting as first conductivity type carriers are formed by evaporation of an element during annealing, is formed on a substrate and dopant impurities producing a second conductivity type are diffused in an annealing step from the impurity layer into the first conductivity type semiconductor layer to form pixel regions. During the diffusion, the surface of the first conductivity type compound semiconductor layer corresponding to non-pixel regions is exposed. In the regions of the first conductivity type semiconductor layer which becomes non-pixel regions, the first conductivity type carrier concentration increases due to the lattice vacancies generated by the evaporation of an element and, even when the dopant impurity is diffused into these regions, these regions remain first conductivity type regions.

6 Claims, 4 Drawing Sheets

METHOD FOR PRODUCING AN INFRARED DETECTOR

FIELD OF THE INVENTION

The present invention relates to a method for producing an infrared detector and, more particularly, to a method for producing an infrared detector having high sensitivity and high resolution.

BACKGROUND OF THE INVENTION

FIGS. 4(a) to 4(f) are cross-sectional views showing a prior art method for producing an infrared detector. As shown in FIG. 4(a), p-type CdHgTe is epitaxially grown on a CdTe substrate 1 by metal organic chemical vapor deposition (MOCVD) or liquid phase epitaxy (LPE) to form a p-type CdHgTe layer 2 about 15 to 20 microns thick. An insulating film 4 comprising ZnS is evaporated and deposited on CdHgTe layer 2 to a thickness of about 2 microns and a diffusion mask pattern shown in FIG. 4(a) is formed by photolithography and etching.

As shown in FIG. 4(b), an In layer 7 is deposited on the insulating film 4 by evaporation. In layer 7 is a diffusion source of dopant impurities producing n-type conductivity in the CdHgTe layer 2.

As shown in FIG. 4(c), indium is thermally diffused from the In layer 7 into the p-type CdHgTe layer 2, forming n-type CdHgTe regions 3. Each region in the p-type CdHgTe layer 2 including the n-type CdHgTe region 3 functions as a pixel.

After the diffusion of indium, as shown in FIG. 4(d), the In layer 7 and the insulating film 4 are removed by etching. An insulating film 10 comprising ZnS is evaporated and deposited on the entire surface of the wafer and an opening 11 and openings 12 are formed at regions where a p-side electrode and n-side electrodes will be formed in a later process, respectively, using photolithography and etching, as shown in FIG. 4(e). Then, a p-side electrode 6 and n-side electrodes 5 are formed in the opening 11 and the openings 12, respectively, completing the infrared detector shown in FIG. 4(f).

In the infrared detector shown in FIG. 4(f), infrared light which is incident on the rear surface of the wafer, i.e., the rear surface of substrate 1, travels through the substrate 1 to reach the pixel region in the p-type CdHgTe layer 2, the n-type CdHgTe region 3, and the pn junction 8 and is absorbed by the n-type CdHgTe region 3, thereby producing electron and hole pairs. Then, the electron-hole pairs are separated into electrons and holes by the pn junction 8 at the boundary between the p-type CdHgTe layer 2 and the n-type CdHgTe region 3 whereby an electromotive force is generated between the p-type CdHgTe layer 2 and the n-type CdHgTe region 3. By detecting this electromotive force, the intensity of the incident infrared light is determined.

In order to enhance the sensitivity of such an infrared detector, the crystalline structure of the semiconductor layer functioning as a pixel must be as uniform as possible for swift movement of electrons and holes. Therefore, when producing pixel regions by diffusing dopant impurities, it is desired to form regions having few crystal defects by using as high a temperature as possible. On the other hand, in order to improve the performance of the infrared detector, it is necessary to improve resolution as well as sensitivity. More specifically, in the infrared detector shown in FIG. 4(f), it is necessary to narrow the width of the non-pixel region WP where only the p-type CdHgTe layer 2 exists. Thereby, the pixel regions including the n-type CdHgTe regions 3 are densely produced.

In the prior art production method shown in FIGS. 4(a)–4(f), a mask is used to make the width of the non-pixel region 2a adjacent to the respective pixel regions narrow, i.e., to make the interval between the centers of the adjacent pixel regions less than 50 microns, for a high density of pixels. Indium is diffused from the In layer 7 by heating these layers and regions to a high temperature (for example, 200° C. or more) to form the CdHgTe regions 3. The diffusion not only advances in the depth direction but also advances in the transverse direction, parallel to the substrate surface, as shown in FIGS. 5(a) to 5(c), whereby the p-type CdHgTe layer 2 beneath the insulating film 4 is also converted to n-type. Therefore, the non-pixel region 2a occupied by only the p-type CdHgTe layer 2 is narrower than required and the conductivity type of the region beneath the mask 4 is sometimes completely converted to n-type, as shown in FIG. 5(d). In the infrared detector thus produced, resolution is not improved but, on the contrary, is reduced.

SUMMARY OF THE INVENTION

It is an object of the present invention to provide a method for producing an infrared detector having a high resolution and improved detection sensitivity Other objects and advantages of the present invention will become apparent from the detailed description given hereinafter. The detailed description and specific embodiments are provided for illustration only, since various additions and modifications within the spirit and scope of the invention will become apparent to those of skill in the art from the detailed description.

According to the present invention, in a method for producing an infrared detector, a first conductivity type semiconductor layer is formed on a substrate. In the layer, lattice vacancies which produce the first conductivity type are formed at the surface and extend into the semiconductor layer by annealing. Dopant impurities producing a second conductivity type are diffused from a second conductivity type dopant impurity layer disposed on the first conductivity type semiconductor layer into the first conductivity type semiconductor layer to form pixel regions. During the solid-state diffusion, the surface of the first conductivity type semiconductor layer corresponding to non-pixel regions, other than the diffusion windows, is exposed. Therefore, in the regions of the first conductivity type semiconductor layer which become non-pixel regions, the first conductivity type carrier concentration increases due to the lattice vacancies extending from the surface and produced by the evaporation of an element. Even when the second conductivity type impurities are diffused into these regions, these regions remain the first conductivity type without being converted to the second conductivity type.

DETAILED DESCRIPTION OF THE PREFERRED EMBODIMENT

Figure 1A:
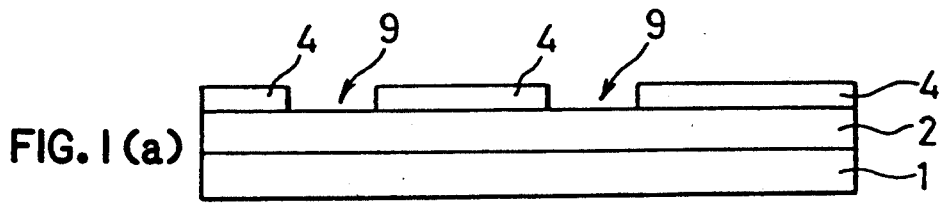
FIGS. 1(a) to 1(g) are cross-sectional views showing a method for producing an infrared detector in accordance with an embodiment of the present invention.

FIGS. 1(a) to 1(g) are cross-sectional views illustrating a method for producing an infrared detector in accordance with an embodiment of the present invention. In FIGS. 1(a)–1(g), the same reference numerals as those shown in FIGS. 4(a)–4(f) and 5(a)–5(d) designate the same or corresponding parts.

As shown in FIG. 1(a), a p-type CdHgTe layer 2 is grown on the CdTe substrate 1 to a thickness of about 15 to 20 microns by an epitaxial growth method, such as LPE. Then, an insulating film 4 is formed on the p-type CdHgTe layer 2 by evaporating ZnS to a thickness of about 2 microns and openings 9 about 10 to 15 microns wide are formed in the insulating film 4 by photolithography and etching. The openings 9 are positioned at approximately the center of corresponding n-type CdHgTe regions 3 which become pixel regions in later process steps. The interval between the centers of adjacent openings 9 is approximately 30 to 50 microns.

Figure 1B:
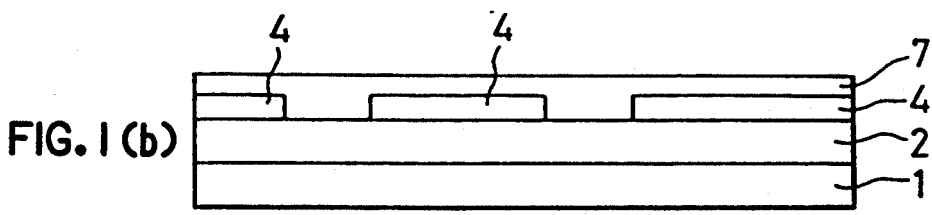
Figure 1C:
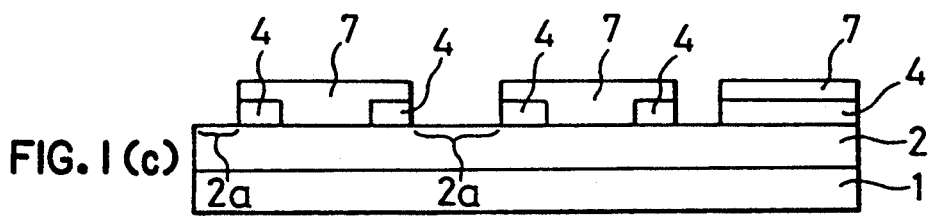

Indium is evaporated and deposited on the entire surface to form an In layer 7 as shown in FIG. 1(b). In layer 7 is a diffusion source of a dopant impurity producing the second conductivity type. Then, wet etching, using a positive resist and hydrochloric acid, partially removes the insulating film 4 and the In layer 7 from the regions of the p-type CdHgTe layer 2 which become non-pixel regions 2a, as shown in FIG. 1(c). The width of the removed portion is approximately 10 to 15 microns and the width of the insulating film 4 remaining on the region functioning as a pixel region in the p-type CdHgTe layer 2 is approximately 5 to 10 microns.

Figure 1D:
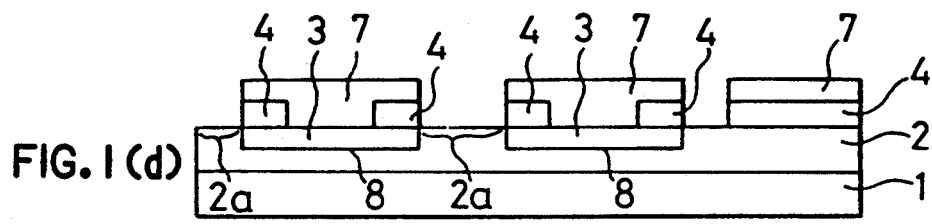

As shown in FIG. 1(d), by annealing, indium is diffused from the In layer 7 into the p-type CdHgTe layer 2 using the remaining insulating film 4 as a diffusion mask, thereby forming the n-type CdHgTe regions 3. Thus, pixel regions, each having a pn junction 8, are formed in the first conductivity type semiconductor layer 2. The solid-phase diffusion is carried out for about 30 minutes for the surfaces of regions in the p-type CdHgTe layer 2 which become non-pixel regions 2a. The temperature of the diffusion is about 200° C. or more and the Hg vapor pressure in the diffusion atmosphere is lower than the equilibrium Hg vapor pressure at the annealing temperature. While the solid-state diffusion advances, Hg evaporates from the regions of the p-type CdHgTe layer 2 which become non-pixel regions 2a and which are exposed on the surface. Thus, lattice vacancies are produced in the p-type CdHgTe layer 2 due to the evaporation of Hg and these lattice vacancies function as acceptors, producing holes, i.e., p-type carriers, so that the p-type conductivity of the CdHgTe layer 2 increases. As a result, even when indium is diffused into the regions in the p-type CdHgTe layer 2 which become non-pixel regions 2a, the doping effect of the indium is cancelled by the high concentration of p-type carriers resulting from the vacancies and the regions remain p-type without being converted to n-type.

Figure 1E:
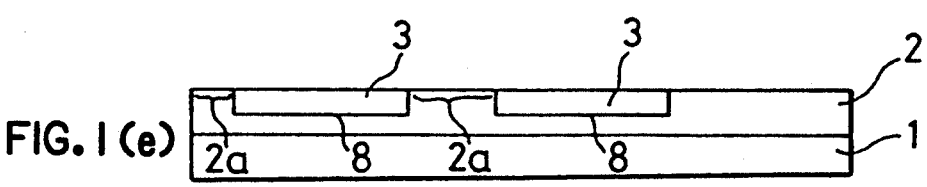
Figure 1F:
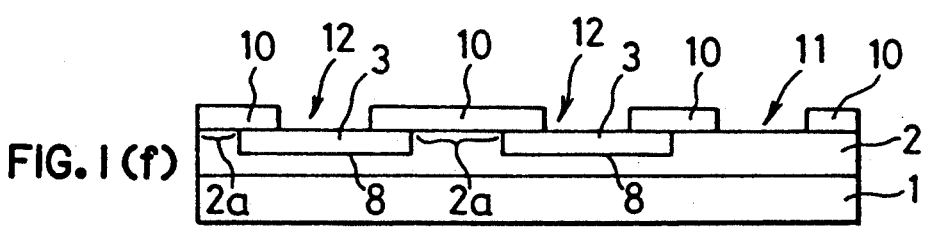
Figure 1G:
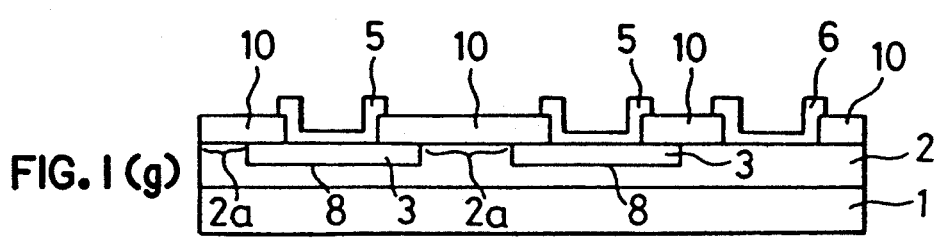

After the n-type CdHgTe regions 3 constituting pixel regions are formed in the p-type CdHgTe layer 2, the In layer 7 and the insulating film 4 are removed by wet etching using hydrochloric acid, as shown in FIG. 1(e). Then, as shown in FIG. 1(f), an insulating film 10 comprising ZnS is evaporated and deposited on the entire surface of the wafer and an opening 11 and openings 12 are formed at the regions where a p-side electrode and n-side electrodes will be formed in the later process, respectively, by photolithography and etching. Then, a p-side electrode 6 and n-side electrodes 5 are formed in the openings 11 and 12, respectively, completing the infrared detector shown in FIG. 4(f).

Figure 3:
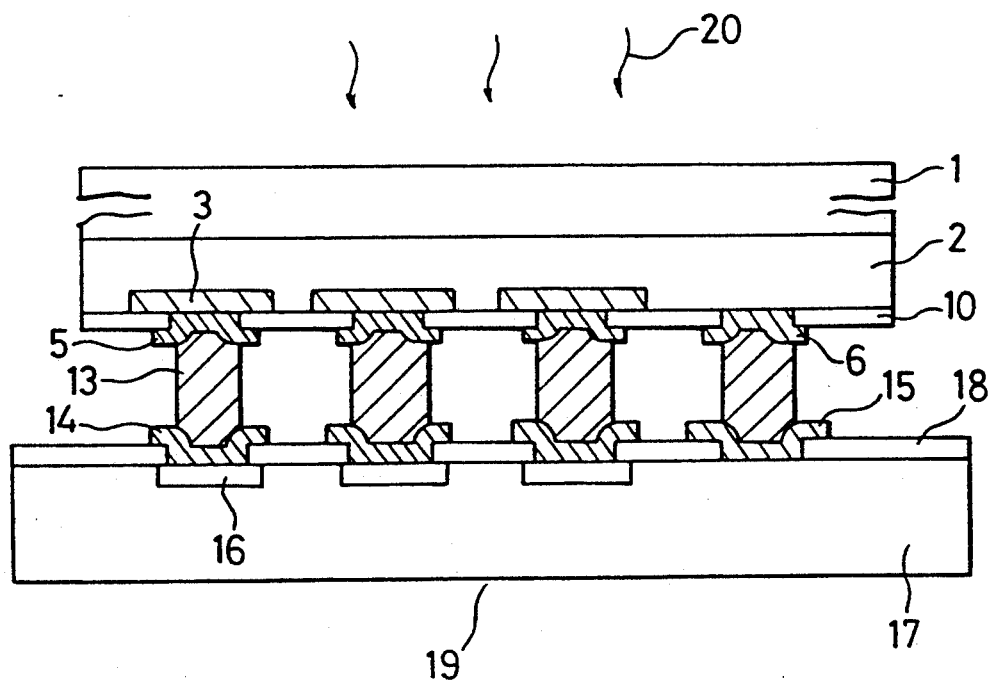
FIG. 3 is a cross-sectional view showing an infrared detector produced by the production method of the present invention connected to another substrate including a CCD for reading out signals.
Figure 4A:
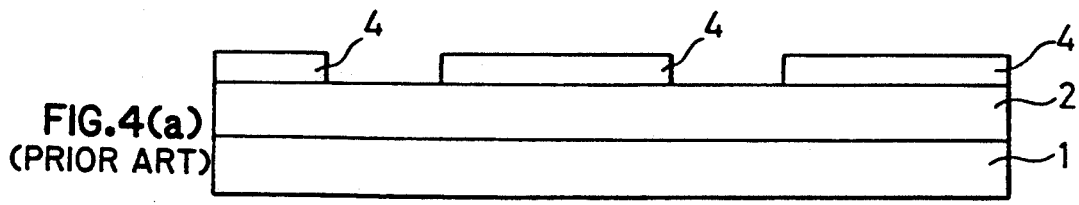
FIGS. 4(a) to 4(f) are cross-sectional views showing a method for producing an infrared detector in accordance with the prior art.
Figure 4B:
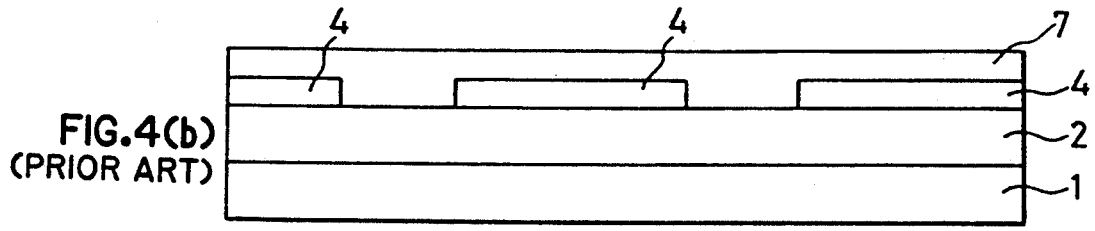
Figure 4C:
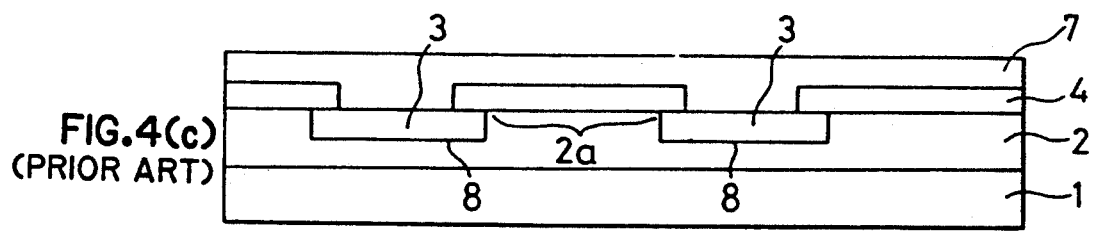
Figure 4D:
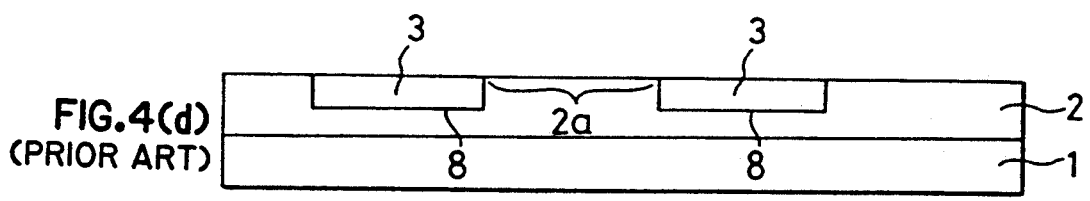
Figure 4E:
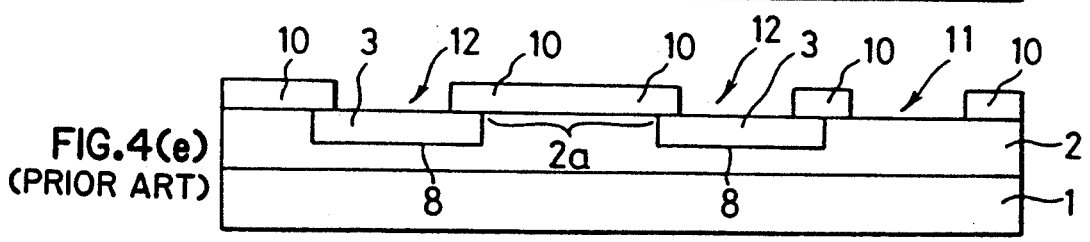
Figure 4F:
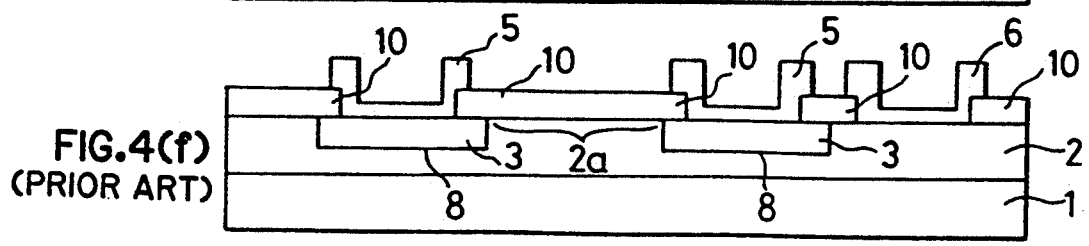
Figure 5A:
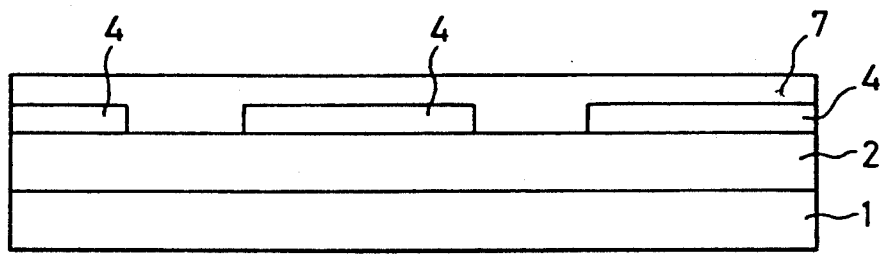
FIGS. 5(a) to 5(d) are cross-sectional views illustrating impurity diffusion in a production method in accordance with the prior art.
Figure 5B:
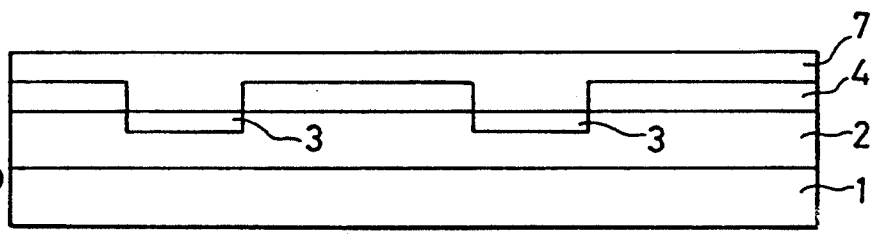
Figure 5C:
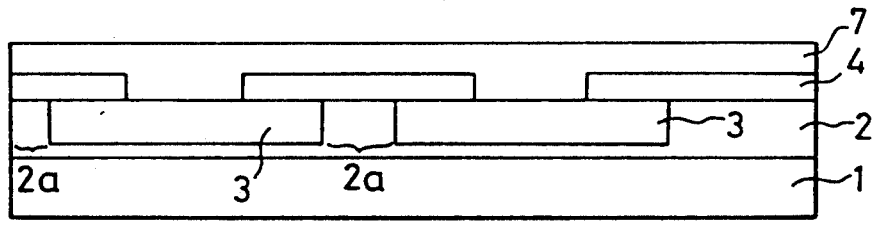
Figure 5D:
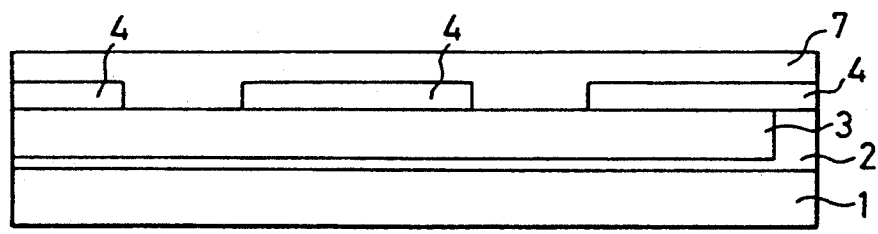

FIG. 3 shows a cross-sectional view of an infrared detector produced by the above-described production method which is connected to a charge coupled device (CCD). The same reference numerals as those in FIGS. 1(a)–1(g) designate the same parts.

In FIG. 3, infrared light 20 which is incident on the rear surface of the CdTe substrate 1 travels through the CdTe substrate 1 to reach into the n-type CdHgTe region 3. The n-type CdHgTe region 3 absorbs the infrared light and generates electron-hole pairs. The electron-hole pairs are separated into electrons and holes by the pn junction 8 at the boundary between the p-type CdHgTe layer 2 and the n-type CdHgTe region 3. The separated electrons and holes rapidly move to the n-side electrode 5 and the p-side electrode 6, respectively, and are successively transferred to an n-type silicon film 16 and a p-type silicon film 17 of a CCD from an n-side electrode 14 and a p-side electrode 15, respectively, which are connected to the CdHgTe materials via indium bumps 13. Thereafter, the charges are transferred in a silicon CCD 19 to an output amplifier (not shown) and read out.

In the production method according to this embodiment, during the solid-phase diffusion of indium, the surfaces of the regions of the p-type CdHgTe layer 2 which become non-pixel regions 2a are exposed, the Hg pressure in the diffusion atmosphere is reduced, and the annealing temperature is as high as 200° C. or more. Therefore, even when the width of the non-pixel region 2a, i.e., the interval between adjacent n-type CdHgTe pixel regions 3, is narrow, the regions of the p-type CdHgTe layer 2 which become non-pixel regions remain p-type and are not converted to n-type. In addition, the n-type CdHgTe pixel region 3 is formed by diffusion at a high temperature, so that it has a uniform crystalline structure.

Figure 2:
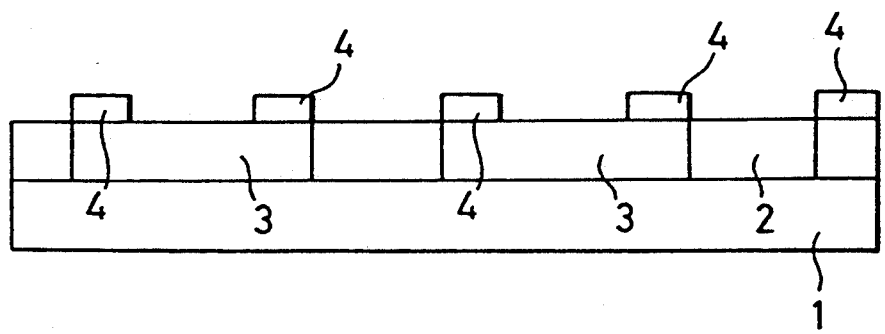
FIG. 2 is a cross-sectional view showing an example of an infrared detector produced in accordance with the present invention.

In the above-illustrated embodiment, the diffusion of indium into the p-type CdHgTe layer 2 may be carried out until the diffusion front reaches the substrate 1, as shown in FIG. 2. However, in this case, the pn junction 8 in the pixel region is only formed at lateral sides of the n-type CdHgTe region 3.

While, in the above illustrated embodiment, a p-type CdHgTe layer is used as a first conductivity type semiconductor layer and indium is used as a dopant impurity producing the second conductivity type, the first conductivity type semiconductor layer may comprise any material so long as an element evaporates from that layer during annealing, thereby increasing the concentration of the first conductivity type carriers. The dopant impurity producing the second conductivity type can be properly selected in accordance with the first conductivity type semiconductor layer.

As is evident from the foregoing description, according to the present invention, the first conductivity type semiconductor layer is a semiconductor layer from which an element evaporates during annealing, producing lattice vacancies which generate charge carriers, increasing the conductivity of the first conductivity type layer, the surfaces of the regions of the first conductivity type semiconductor layer which become non-pixel regions are exposed, and dopant impurities producing the second conductivity type are diffused into the regions of the first conductivity type semiconductor layer which become pixel regions. The predetermined regions of the first conductivity type semiconductor layer which become non-pixel regions remain first conductivity type regions, and the second conductivity type pixel regions formed by annealing have a uniform crystalline structure. As a result, an infrared detector having high resolution and high sensitivity is produced.

What is claimed is:

1. A method of producing an infrared detector comprising:
    forming on a substrate a first conductivity type compound semiconductor layer, the compound semiconductor layer including an element that is evaporated from the compound semiconductor layer upon annealing to produce lattice vacancies exhibiting the first conductivity type;
    depositing an insulating film on the first conductivity type compound semiconductor layer and producing diffusion windows in the insulating film extending to the first conductivity type compound semiconductor layer for diffusing impurities into the first conductivity type compound semiconductor layer;
    depositing a diffusion source layer comprising a dopant impurity producing a second conductivity type opposite the first conductivity type in the compound semiconductor layer on the insulating film and on the first conductivity type compound semiconductor layer in the windows as a diffusion source;
    exposing parts of the surface of the first conductivity type compound semiconductor layer by removing parts of the insulating film and the diffusion layer to form at least two openings having side walls and extending to the first conductivity type compound semiconductor layer with the insulating layer included in the side walls of each opening; and
    diffusing the dopant impurity into the first conductivity type compound semiconductor layer from the diffusion source layer through the windows by annealing to form second conductivity type semiconductor regions in the first conductivity type compound semiconductor layer.

2. The method of producing an infrared detector as defined in claim 1 wherein the element in the compound semiconductor layer is Hg and including diffusing the dopant impurity at an annealing temperature of at least 200° C. and at an Hg pressure lower than the equilibrium Hg vapor pressure of the compound semiconductor layer at the annealing temperature.

3. The method of producing an infrared detector as defined in claim 1 wherein the first conductivity type compound semiconductor layer is p type, the dopant impurity produces n type conductivity in the compound semiconductor layer, and the second conductivity type regions are n type.

4. The method of producing an infrared detector as defined in claim 3 wherein the p type compound semiconductor layer is p type CdHgTe, the dopant impurity is In, and the n type regions are n type CdHgTe.

5. The method of producing an infrared detector as defined in claim 1 wherein the width of the openings at the exposed surface of the first conductivity type compound semiconductor layer is about 10 to 15 microns.

6. The method of producing an infrared detector as defined in claim 5 wherein the thickness of the first conductivity type compound semiconductor layer is 15 to 20 microns, the width of the diffusion windows is 10 to 15 microns, and the width of the insulating film adjacent to the opening is 10 to 15 microns.

* * * * *